(12) United States Patent  
Yang et al.

(10) Patent No.: US 8,716,757 B1  
(45) Date of Patent: May 6, 2014

(54) MONOLITHIC HBT WITH WIDE-TUNING RANGE VARACTOR

(71) Applicants: Yuefei Yang, Torrance, CA (US); Shing-Kuo Wang, Torrance, CA (US)

(72) Inventors: Yuefei Yang, Torrance, CA (US); Shing-Kuo Wang, Torrance, CA (US)

(73) Assignee: Global Communication Semiconductors, Inc., Torrance, CA (US)

( * ) Notice: Subject to any disclaimer, the term of this patent is extended or adjusted under 35 U.S.C. 154(b) by 0 days.

(21) Appl. No.: 13/665,876

(22) Filed: Oct. 31, 2012

Related U.S. Application Data

(60) Provisional application No. 61/716,342, filed on Oct. 19, 2012.

(51) Int. Cl.  
H01L 31/072 (2012.01)  
H01L 31/109 (2006.01)  
H01L 31/0328 (2006.01)

(52) U.S. Cl.  
USPC ............................ 257/197; 257/183; 438/285

(58) Field of Classification Search  
USPC .................. 257/183, 194, 197, 198, E21.403; 438/285  
See application file for complete search history.

(56) References Cited

U.S. PATENT DOCUMENTS

| | | | |
|---|---|---|---|
| 7,081,799 B2 | 7/2006 | Ota et al. | |
| 2008/0197340 A1* | 8/2008 | Mears et al. | 257/21 |
| 2010/0046205 A1* | 2/2010 | Chu et al. | 362/97.1 |
| 2010/0213513 A1 | 8/2010 | Zampardi et al. | |
| 2013/0161698 A1* | 6/2013 | Marino et al. | 257/194 |

FOREIGN PATENT DOCUMENTS

WO    WO 98/09335    3/1998

OTHER PUBLICATIONS

Huang, C., et al., "A GaAs Junction Varactor with a Continuously Tunable Range of 9:1 and an $OIP_3$ of 57 dBm," IEEE Electron Device Letters, vol. 31, No. 2, Feb. 2010, pp. 1-3.  
Song, J., et al., "GaInP/GaAs Double Heterojunction Bipolar Transistor with High $f_T$, $f_{max}$, and Breakdown Voltage," IEEE Electron Device Letters, vol. 15, No. 1, Jan. 1994, pp. 10-12.  
Li, J., et al., "Development of High Breakdown Voltage InGaP/GaAs DHBTs," CS MANTECH Conference, Austin, Texas, May 14-17, 2007, pp. 177-180.  
Zampardi, P.J., et al., "Demonstration of Low-Knee Voltage High-Breakdown GaInP Double HBTs Using Novel Compound Collector Design," IEEE Transactions on Electron Device, vol. 49, No. 4, Apr. 2002, pp. 540-543.  
Neamen, D.A., Semiconductor Physics and Devices: Basic Principles, 3d Ed., McGraw-Hill, 2003, pp. 258-260.

* cited by examiner

Primary Examiner — Phuc Dang  
(74) Attorney, Agent, or Firm — Morgan, Lewis & Bockius LLP

(57) ABSTRACT

A semiconductor device having a tunable capacitance is disclosed, comprising a substrate, a semiconductor base layer comprising a first semiconductor material having a first band-gap, and a plurality of successive semiconductor layers positioned between the substrate and the semiconductor base layer. The plurality of successive semiconductor layers includes a tuning layer comprising a second semiconductor material having a second band-gap larger than the first band-gap. Furthermore, the tuning layer has a non-uniform doping profile with doping concentration that varies in accordance with distance from a surface of the tuning layer proximal to the semiconductor base layer. The tunable capacitance of the semiconductor device varies in accordance with an applied voltage between the base layer and one of the successive semiconductor layers.

24 Claims, 10 Drawing Sheets

MONOLITHIC HBT WITH WIDE-TUNING RANGE VARACTOR

RELATED APPLICATIONS

This application claims priority to U.S. Provisional Application 61/716,342, "Monolithic HBT with Wide-Tuning Range Varactor," filed Oct. 19, 2012, which is incorporated herein by reference in its entirety.

FIELD

The present application relates to semiconductor devices for use in radio frequency applications, to variable capacitance capacitors and heterojunction bipolar transistors, and to voltage-controlled oscillators using such components.

BACKGROUND

While the benefits of implementing virtually any electronic circuit on a single integrated circuit (IC) are well known, some electronic circuits are difficult to implement as a monolithic, single IC (sometimes called MMICs for monolithic microwave integrated circuits), because distinct elements of the circuit require properties that are not desirable in other elements. In the case of wide-band microwave-range voltage controlled oscillators (VCOs), the variable capacitor element (varactor) needs a high breakdown voltage to implement a wide tuning frequency range, and the high breakdown voltage typically requires a thick layer of the relevant material, which leads to a higher resistance in that layer than a thinner layer of the same material. While that is not an issue in the varactor, using the same set of material layers for the transistor element of a VCO would result in unsatisfactory transistor performance, due to the relatively longer transit time in the collector. As a result, wide-band microwave frequency VCOs are typically not implemented as MMICs.

SUMMARY

A semiconductor device has tunable capacitance that varies in accordance with a voltage applied between a first contact and a second contact. The semiconductor device comprises a substrate, a semiconductor base layer comprising a first semiconductor material having a first band-gap, and a plurality of successive semiconductor layers positioned between the substrate and the semiconductor base layer. The plurality of successive semiconductor layers includes a tuning layer comprising a second semiconductor material having a second band-gap larger than the first band-gap. The tuning layer also has a non-uniform doping profile with a doping concentration that varies in accordance with the distance from the surface of the tuning layer proximal to the semiconductor base layer. The first contact is electrically coupled to the semiconductor base layer and the second contact is electrically coupled to a respective layer in the plurality of successive semiconductor layers.

In some embodiments, the device comprises a heterojunction bipolar transistor (HBT) having a base, collector and emitter. The semiconductor base layer comprises the base of the HBT. At least one respective layer of the plurality of successive semiconductor layers comprises the collector of the HBT. The device further comprises one or more additional semiconductor layers that comprise the emitter of the HBT. At least one of the additional semiconductor layers comprises a third semiconductor material having a third band-gap.

In some embodiments, the HBT is a double heterojunction bipolar transistor, and the first band-gap (e.g., the band-gap corresponding to the semiconductor base layer), is smaller than the second band-gap and the third band gap. In some embodiments, the HBT is a single heterojunction bipolar transistor, and the first band-gap and the third band-gap are the same or nearly the same.

In some embodiments, the device comprises a voltage controlled oscillator that includes an HBT and at least one additional circuit element. The HBT includes the substrate, a semiconductor base layer, plurality of successive semiconductor layers positioned between the substrate and the semiconductor base layer, the first contact and the second contact.

In some embodiments, the device comprises a voltage controlled oscillator that includes a varactor and at least one additional circuit element. The varactor includes the substrate, a semiconductor base layer, plurality of successive semiconductor layers positioned between the substrate and the semiconductor base layer, the first contact and the second contact.

In some embodiments, at least one of the semiconductor substrate and a respective layer of the plurality of successive semiconductor layers, excluding the tuning layer, comprises gallium arsenide (GaAs).

In some embodiments, the tuning layer comprises an indium gallium phosphide (InGaP) layer.

In some embodiments, the non-uniform doping profile of the tuning layer comprises a graded doping profile that monotonically decreases from the surface of the tuning layer proximal to the semiconductor base layer to an opposing surface of the tuning layer distal to the semiconductor base layer.

In some embodiments, the non-uniform doping profile is a staircase doping profile.

In some embodiments, the non-uniform doping profile is a hyper-abrupt doping profile.

In some embodiments, the plurality of semiconductor layers positioned between the substrate and the semiconductor base layer includes a transition layer between the tuning layer and the semiconductor base layer.

In some embodiments, the transition layer is a layer of the same material as the semiconductor base layer, but with a different doping type than a doping type of the semiconductor base layer.

In some embodiments, a semiconductor device comprises a substrate, a transistor structure positioned on the substrate, and a varactor structure positioned on the substrate physically separated from the transistor structure. The varactor and the transistor have distinct instances of a common set of layers.

BRIEF DESCRIPTION OF THE DRAWINGS

Like reference numerals refer to corresponding parts throughout the drawings.

DESCRIPTION OF EMBODIMENTS

Figure 1:
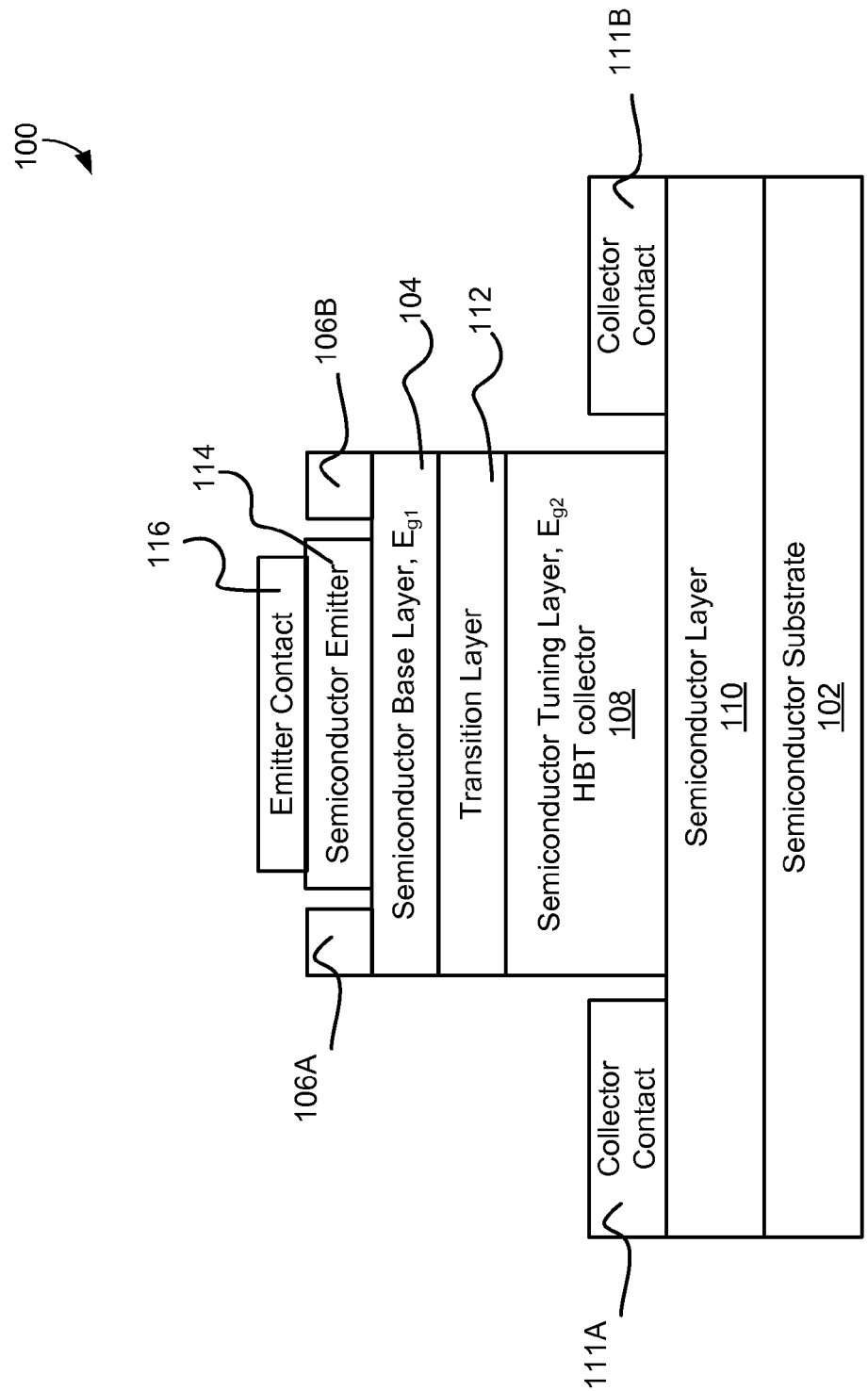
FIG. 1 is a schematic cross-sectional view of a heterojunction bipolar transistor (HBT) in accordance with some embodiments.

FIG. 1 is a schematic cross-sectional view of a heterojunction bipolar transistor (HBT) 100 in accordance with some embodiments. Instances of HBT 100 that are used as bipolar transistors exhibit low emitter-collector resistance, while instances of HBT 100 that are used as a varactor (e.g., using the base and collector as terminals of the varactor) provide a wide-tuning range. In some implementations of the varactor, a non-uniform doping concentration in a tuning layer (e.g., tuning layer 108) provides a capacitance that varies inversely with the square of the applied voltage. The varactor with this voltage versus capacitance relationship, can then be used in a voltage-controlled oscillator, incorporating an instance of HBT 100 used as a bipolar transistor and an instance of the varactor, having a linear voltage versus frequency relationship.

In some embodiments, HBT 100 is an npn HBT. Alternatively, HBT 100 is a pnp HBT. For convenience of explanation, embodiments will be described with reference to an npn HBT. It should be appreciated, however, that the following discussion is applicable to pnp HBTs as well.

HBT 100 is fabricated on a semiconductor substrate 102 comprising any material such as gallium arsenide (GaAs), indium phosphate (InP), silicon (Si), silicon germanium (SiGe), silicon carbide (SiC), gallium nitride (GaN), sapphire, quartz, or an alloy of such materials. For convenience, alloys of materials will be referred to by the name or chemical symbol of their parent compound. For example, any molar ratio of silicon and germanium (e.g., $Si_xGe_{1-x}$, or alloys of $Si_xGe_{1-x}$ containing additional dopants) are herein referred to as silicon germanium, or by the chemical symbol SiGe. As another example, any molar ratio of indium, gallium and arsenide (e.g., $In_xGa_{1-x}As$, or alloys of $In_xGa_{1-x}As$ containing additional dopants) are herein referred to as InGaAs. As another example, any molar ratio of indium, gallium and phosphate (e.g., $In_xGa_{1-x}P$, or alloys of $In_xGa_{1-x}P$ containing additional dopants) are herein referred to as InGaP. In some instances, semiconductor substrate 102 is a wafer of a semiconductor material. Alternatively, semiconductor substrate 102 is a portion of a wafer of a semiconductor material (e.g., a chip or die). In some embodiments, semiconductor substrate 102 is nearly intrinsic (e.g., is very lightly doped or not doped at all). Alternatively, semiconductor 102 is extrinsic (e.g., doped with p-type dopants or n-type dopants).

Figure 2:
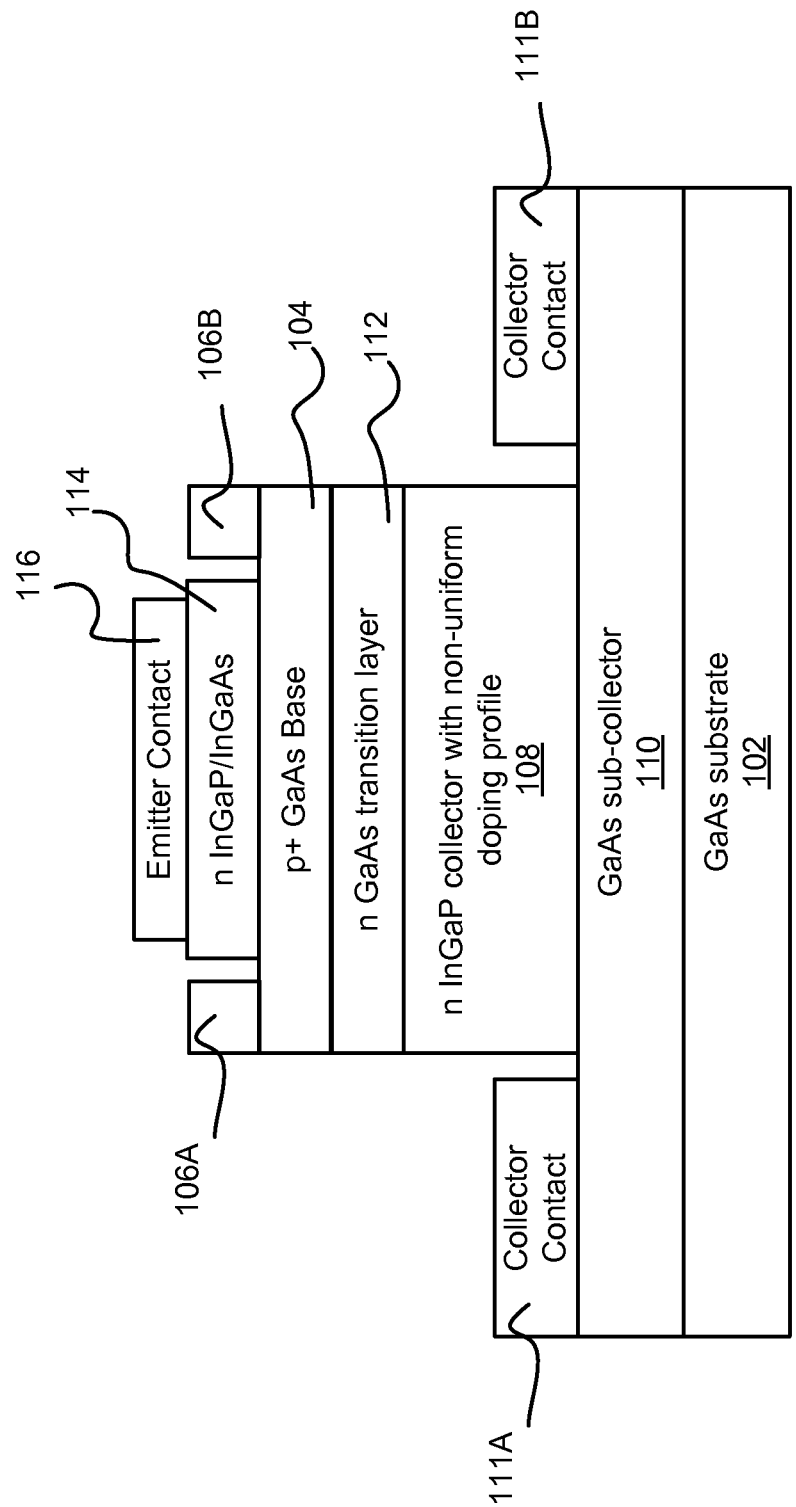
FIG. 2 is a schematic cross-sectional view of a heterojunction bipolar transistor (HBT) with an n-InGaP collector layer, the n-InGaP collector layer having a non-uniform doping profile in accordance with some embodiments.

HBT 100 contains a semiconductor base layer 104 comprising a first semiconductor material with a first band-gap, $E_{g1}$, electrically coupled to base contacts 106A-B. In some implementations, as shown in FIG. 2, semiconductor base layer 104 is a p-type material such as p-doped GaAs with a thickness of 200-1000 Å and doping concentrations in the range of $1\times10^{18}$ cm$^{-3}$ to $5\times10^{19}$ cm$^{-3}$. HBT 100 also includes a plurality of successive semiconductor layers positioned between semiconductor substrate 102 and semiconductor base layer 104. For example, the plurality of successive semiconductor layers includes a tuning layer 108 comprising a second semiconductor material with a second band-gap, $E_{g2}$. In some instances, tuning layer 108 functions as the collector of the HBT. In some instances, the second semiconductor material is InGaP, as shown in the example in FIG. 2. Alternatively, the second semiconductor material is GaAs. Because of its function as the collector of HBT 100, it is desirable to keep tuning layer 108 thin in order to lower the transit time of HBT 100. As explained in more detail below, tuning layer 108 has a non-uniform doping profile with a doping concentration that varies in accordance with the distance from the surface of the tuning layer proximal to the semiconductor base layer. Aspects of the non-uniform doping layer, including its functionality, will be discussed with reference to FIGS. 3-6.

Semiconductor layer 110 is also included in the plurality of successive semiconductor layer. In some embodiments, semiconductor layer 110 is the sub-collector of the HBT. In some embodiments, an example of which is shown in FIG. 2, semiconductor layer 110 comprises the same material as semiconductor substrate 102 (e.g., GaAs) but with different doping profiles. For example, in some instances, semiconductor layer 110 is n+ doped with doping concentrates in excess of $4\times10^{18}$ cm$^{-3}$. Semiconductor layer 110 is electrically coupled to collector contacts 111A-B.

In some embodiments, HBT 100 includes a transition layer. In some instances, transition layer 112 is a setback layer that provides band-gap smoothing and suppresses an electron blocking effect. In some instances, an example of which is shown in FIG. 2, transition layer 112 comprises a 200-600 Å thick sub-layer of GaAs ranging from undoped to n-doped with doping concentrations up to $5\times10^{16}$ cm$^{-3}$. In some instances, transition layer 112 further comprises a 50-100 Å thick delta doping sub-layer comprising highly n-doped InGaP (e.g., doping ranging from $1\times10^{18}$ cm$^{-3}$ to $3\times10^{18}$ cm$^{-3}$). In some implementations, transition layer 112 includes a plurality of successive semiconductor sublayers. In some implementations, the plurality of successive semiconductor sublayers include ternary or quaternary semiconductor layers that function to smooth out conduction band discontinuity between the base and collector layers.

HBT 100 also contains additional layers which comprise a semiconductor emitter 114. At least one of the layers in emitter 114, for example a layer adjacent base 104, comprises a third semiconductor material with a third band-gap, $E_{g3}$. In some instances, the third band-gap is also larger than the first band-gap, in which case HBT 100 is a double heterojunction bipolar transistor (DHBT). Emitter 114 also typically includes one or more semiconductor emitter contact layers positioned between the third semiconductor layer and emitter contact 116. The semiconductor emitter contact layers are electrically coupled to emitter contact 116, and a topmost layer of the semiconductor emitter contact layers is physically connected to emitter contact 116 as well.

Semiconductor layers such as those layers discussed above can be grown on semiconductor substrate 102 using any suitable means. In some implementations, the semiconductor layers are grown using an epitaxial growth method, such as molecular beam epitaxy, atomic layer epitaxy, or metalorganic vapor phase epitaxy. When patterning is necessary, patterning is achieved using techniques such as optical lithography, electron beam lithography, wet etching, dry etching and lift-off techniques. Such techniques can be used alone or in combination to produce the desired patterning.

Contacts, such as base contact 106A-B, collector contact 111A-B, and emitter contact 116 provide a conducting path between the device and external circuit elements. Contacts can be any suitable conducting material, for example metal or polysilicon, and in some implementations includes multiple layers of materials, as well known in the art. Metal contacts can be deposited using a variety of metal deposition techniques (such as RF or DC sputtering, electroplating, evaporation, pulsed laser deposition, etc) and patterned using the techniques described above.

FIG. 2 is a schematic cross-sectional view of a particular example of a heterojunction bipolar transistor (HBT) described with reference to FIG. 1. In addition, semiconductor emitter 114 comprises the exemplary structure of sublayers described in TABLE 1. The "x" factor in TABLE 1, also called the Indium fractional component, refers to the "x" subscript in $In_xGa_{1-x}As$ and $In_xGa_{1-x}P$. More generally, the emitter is, or includes, an InGaP layer, a GaAs layer, and/or an InGaAs layer.

TABLE 1

| Material | x | Thickness(Å) | Doping (cm$^{-3}$) |
|---|---|---|---|
| n InGaAs | 0.6 | 300-700 | 0.5 to 1 × 10$^{19}$ cm$^{-3}$ |
| n InGaAs | 0-0.6 | 300-700 | 0.5 to 1 × 10$^{19}$ cm$^{-3}$ |
| n GaAs | 0 | 1000-1500 | 2 to 4 × 10$^{18}$ cm$^{-3}$ |
| n InGaP | 0.49 | 300-600 | 1 to 3 × 10$^{17}$ cm$^{-3}$ |

Figure 3A:
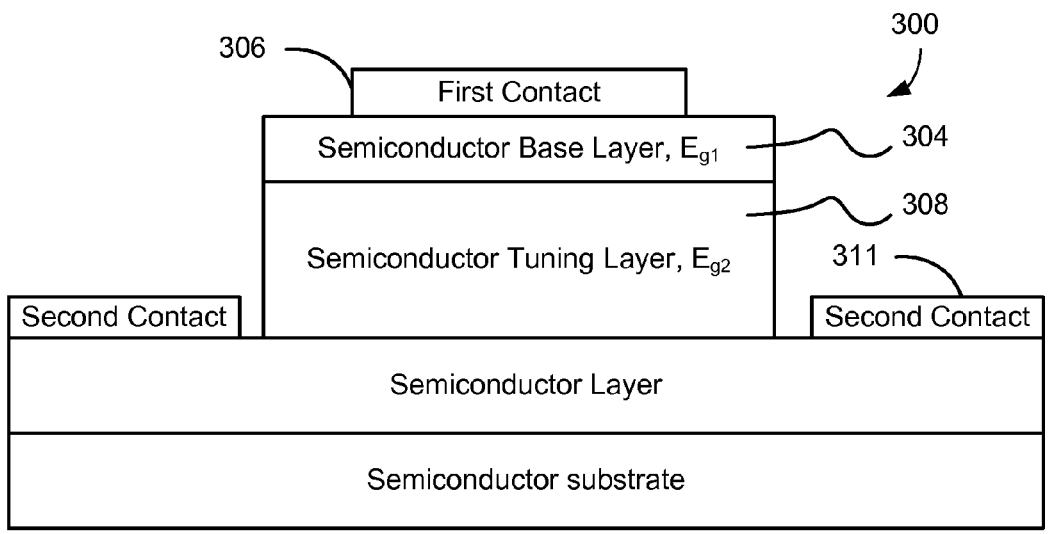
FIGS. 3A-3B are schematic diagrams with cross-sectional views of a semiconductor device having a tunable capacitance in accordance with some embodiments.

FIG. 3A is schematic cross-sectional view of a varactor 300 having a tunable capacitance in accordance with some embodiments. In some implementations, varactor 300 and HBT 100 are part of a MMIC. In such cases, it is desirable for fabrication reasons for varactor 300 and HBT 100 to share distinct instances of a common set of layers. To achieve this, the base-collector junction diode of an instance of HBT 100 is, in some implementations, used as varactor 300. In some implementations, varactor 300 comprises a subset of the layers described with reference to HBT 100, which simplifies the process of fabricating varactor 300 and HBT 100 on the same chip. For example, the semiconductor base layer 304 in varactor 300 is an instance of a base layer such as base layer 104 described with reference to HBT 100. In some other implementations, varactor 300 and HBT 100 have identical layers, including the emitter structure previously described, and the MMIC is configured to use the base-collector junction diode as a tunable capacitance device in varactor 300. In such implementations, the emitter structure (not shown) of the varactor is unused (e.g., connected to the base contact, or the emitter contact is unconnected).

In some embodiments, first contact 306 is electrically coupled to base layer 104 and second contact 311 is electrically coupled to semiconductor layer 110. As discussed with reference to FIG. 1, semiconductor base layer 104 and semiconductor tuning layer 108 have opposite doping types (e.g., semiconductor base layer 104 is p-doped and semiconductor tuning layer 108 is n-doped). Thus, varactor 300 a pn-junction having a depletion region within the device. The depletion region has a "depletion width" that varies with material properties, including doping concentration, on either side of the junction. In embodiments implemented with a npn-type HBT 100, varactor 300 is operated in reverse bias by holding second contact 311 at a higher voltage than first contact 306. The depletion width of varactor 300, and hence the capacitance is varied according to the applied reverse bias as well as the doping concentration in tuning layer 308. In order to increase the capacitance tuning range of varactor 300, the breakdown voltage of tuning layer 108 needs to be relatively high. The use of a larger band-gap material (as compared to GaAs), such as InGaP, as the second semiconductor material helps to mitigate the problem of breakdown voltage while maintaining an acceptably thin collector to provide the low transit time needed for HBT performance.

Figure 3B:
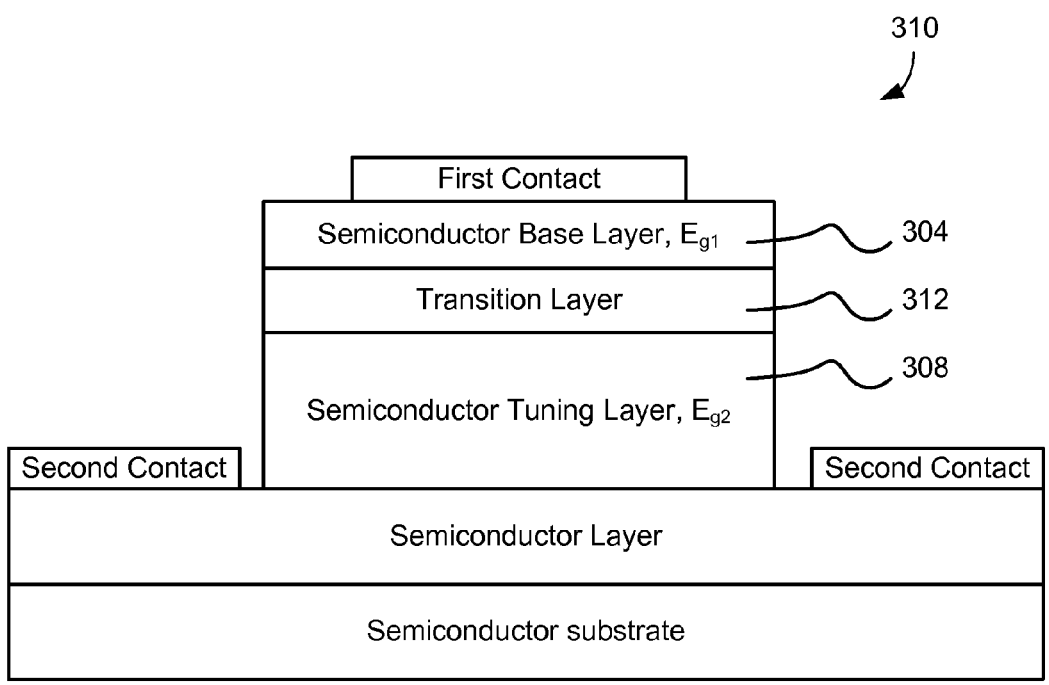

FIG. 3B is a schematic cross-sectional view of a varactor 310. Varactor 310 shares analogous layers to those described with reference to varactor 300. Varactor 310 also has an instance of a transition layer 312, similar to transition layer 112 described with reference to HBT 100.

Figure 3C:
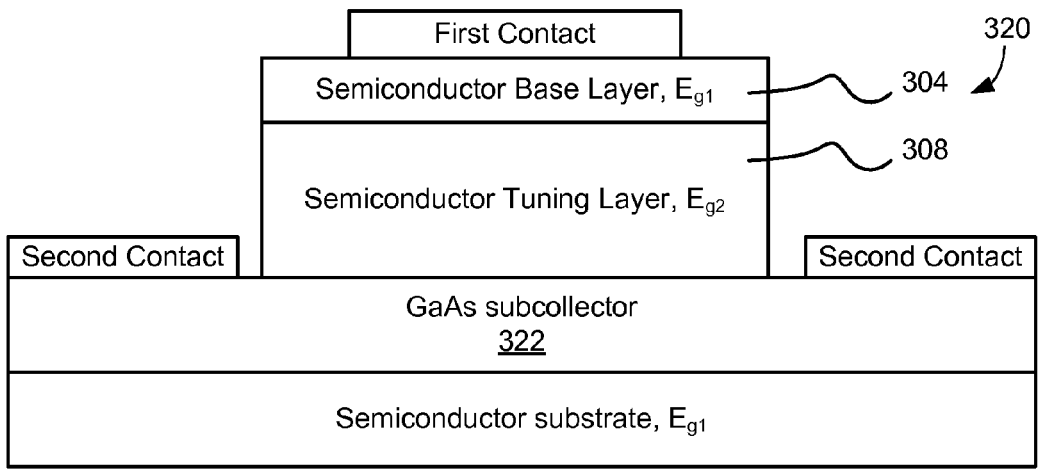
FIGS. 3C-3D are schematic diagrams with cross-sectional views of a semiconductor device with a tuning layer in accordance with some embodiments.

FIG. 3C is a schematic cross-sectional view of a varactor 320. Varactor 320 shares analogous layers to those described with reference to varactor 300. Varactor 320 also has an instance of a GaAs sub-collector 322, similar to semiconductor layer 110 described with reference to HBT 100.

Figure 3D:
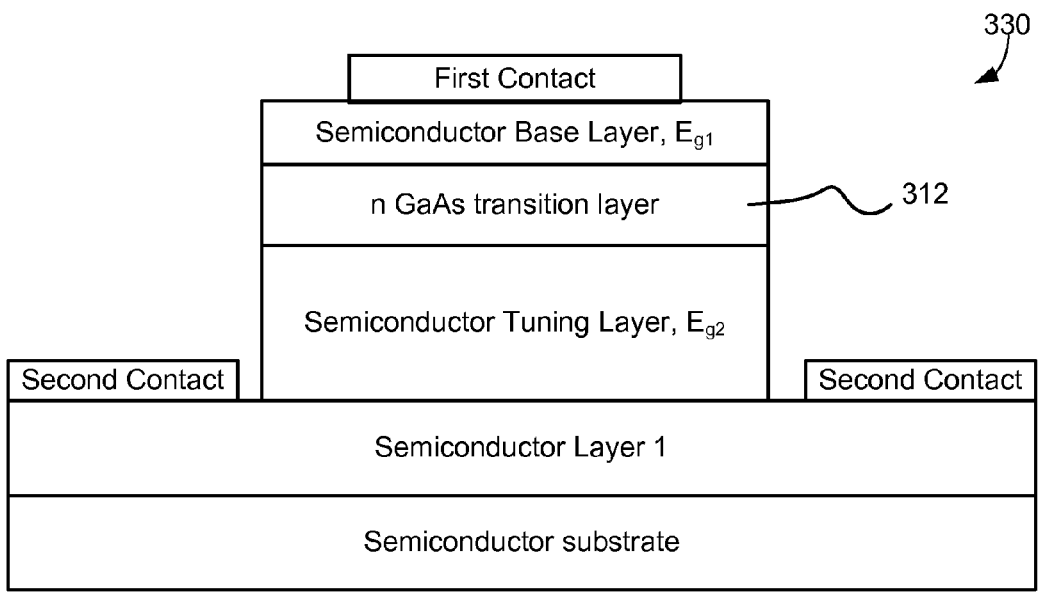

FIG. 3D is a schematic cross-sectional view of a varactor 330. Varactor 330 shares analogous layers to those described with reference to varactor 300. Varactor 330 also has an instance of an n-doped GaAs transition layer 312, similar to transition layer 112 described with reference to HBT 100.

Figure 3E:
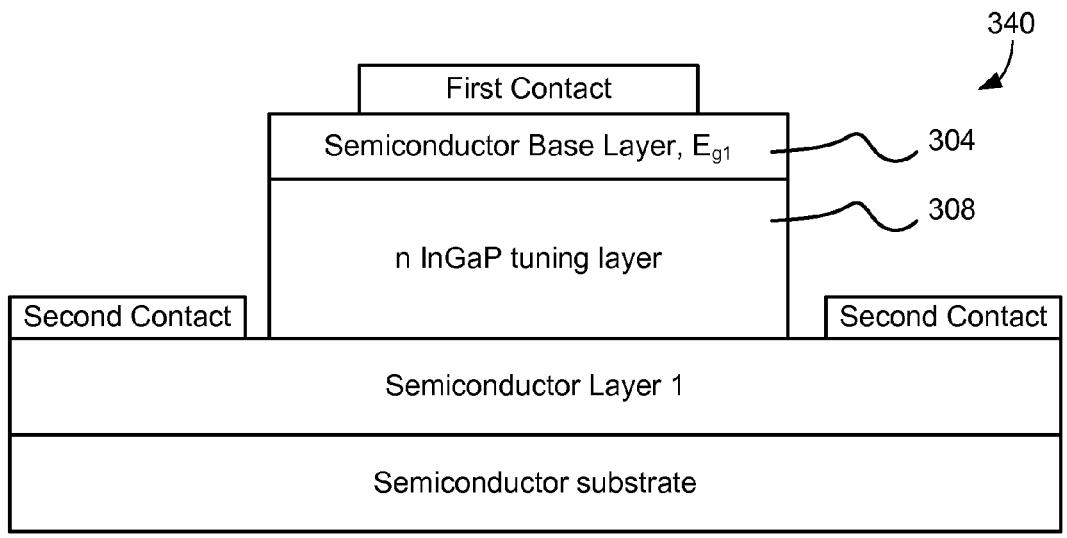
FIGS. 3E-3F are schematic diagrams with cross-sectional views of a semiconductor device with an n-InGaP tuning layer in accordance with some embodiments.

FIG. 3E is a schematic cross-sectional view of a varactor 340. Varactor 340 shares analogous layers to those described with reference to varactor 300. Varactor 340 also has an instance of an n-doped InGaP tuning layer 308, similar to semiconductor layer 108 described with reference to HBT 100.

Figure 3F:
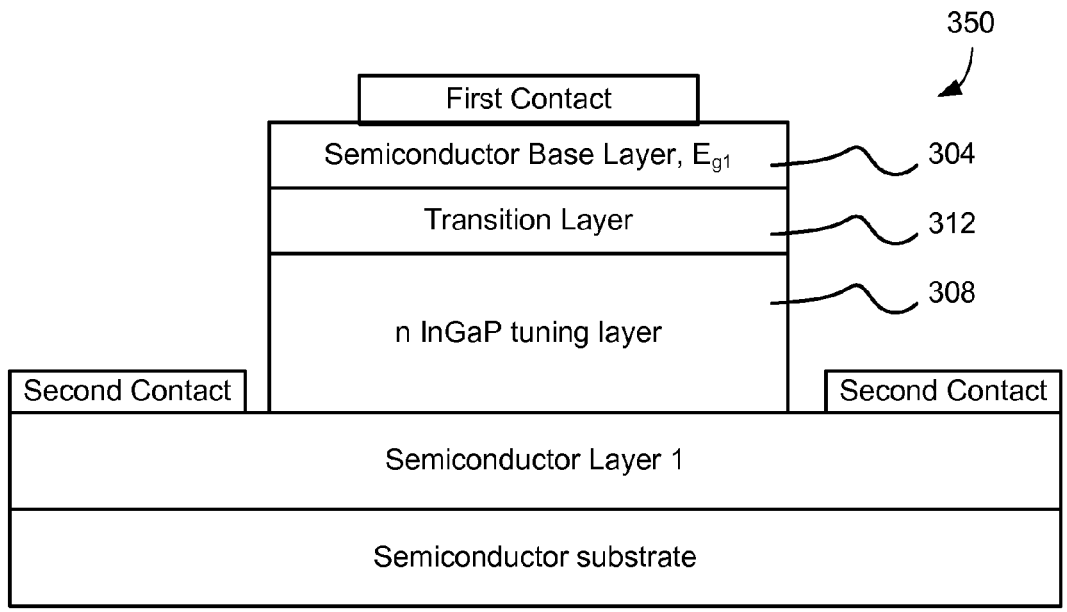

FIG. 3F is a schematic cross-sectional view of a varactor 350. Varactor 350 shares analogous layers to those described with reference to varactor 300. Varactor 350 also has an instance of a n-doped GaAs transition layer 312, similar to transition layer 112, and an instance of a n-doped InGaP tuning layer 308, similar to tuning layer 108, both described above with reference to HBT 100.

Figure 4A:
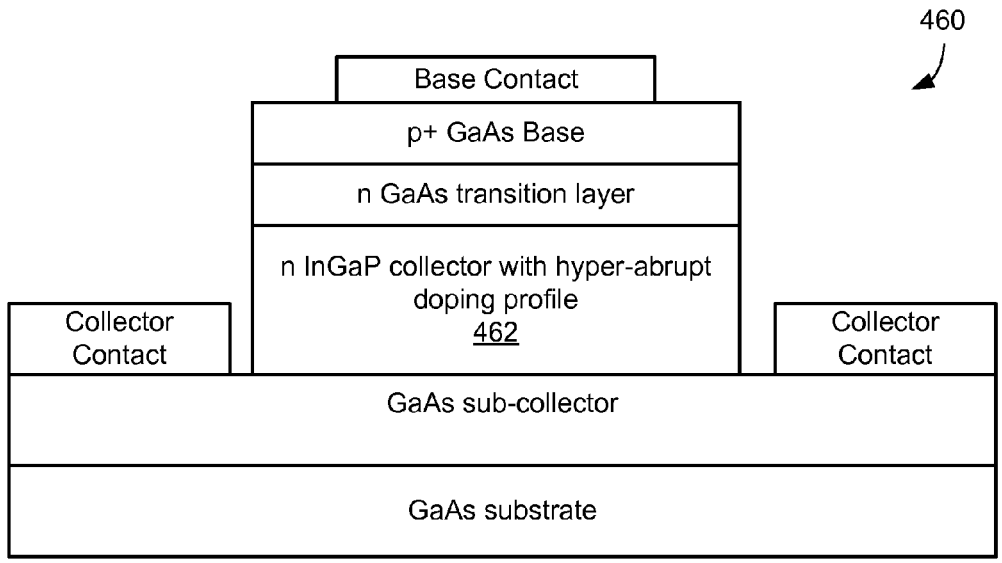
FIGS. 4A-4B are schematic diagrams with cross-sectional views of a semiconductor device with a tuning layer, the tuning layer having various non-uniform doping profiles in accordance with some embodiments.

FIG. 4A is a schematic cross-sectional view of a varactor 460. Varactor 460 shares analogous layers described to those with reference to varactor 300. Varactor 460 also has a tuning layer 462 that is an n-doped InGaP collector with a hyper-abrupt doping profile. The hyper-abrupt doping profile is discussed in greater detail with reference to FIG. 5.

Figure 4B:
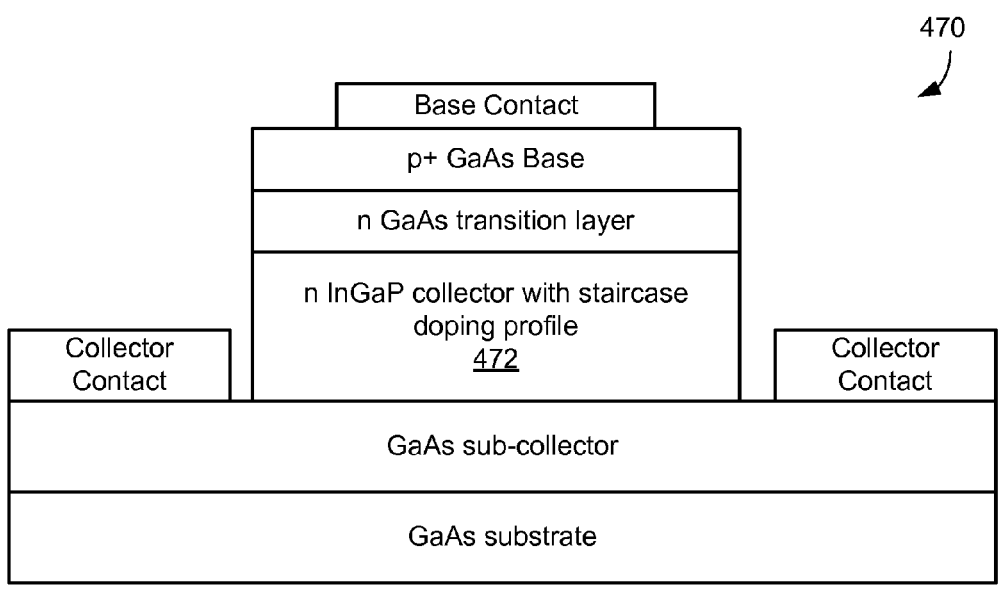

FIG. 4B is a schematic cross-sectional view of a varactor 470. Varactor 470 shares analogous layers described with reference to varactor 300. Varactor 470 also has a tuning layer 472 that is an n-doped InGaP collector with a staircase doping profile. The staircase doping profile is discussed in greater detail with reference to FIG. 6.

Figure 5:
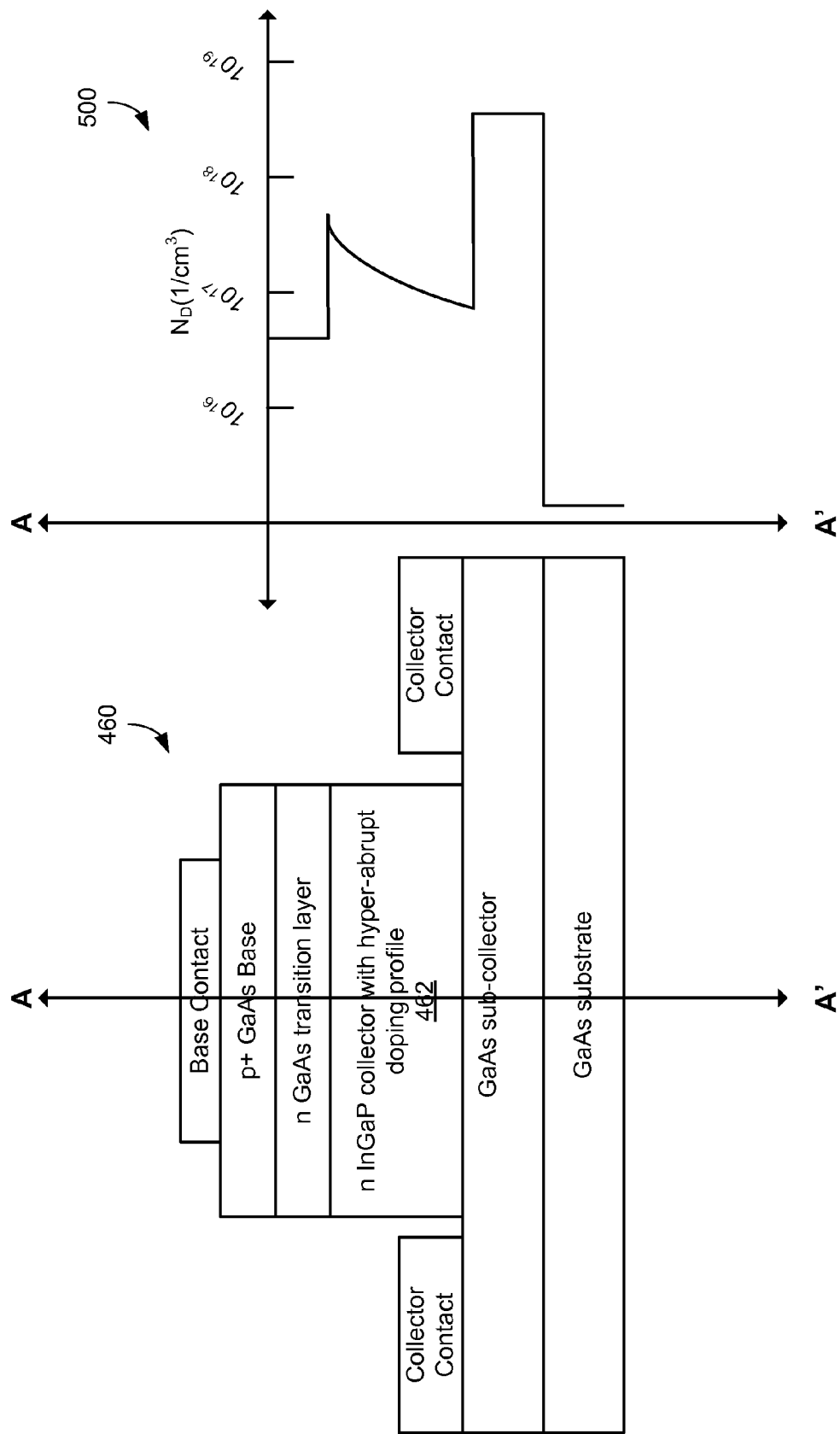
FIG. 5 is a schematic diagram with a cross-sectional view of a semiconductor device with a corresponding graph illustrating a hyper-abrupt non-uniform doping profile in the tuning layer in accordance with some embodiments.

FIG. 5 illustrates a hyper-abrupt non-uniform doping profile in tuning layer 462 of varactor 460. A schematic cross-sectional view of varactor 460 is shown as well as a simplified representation of a plot 500 of the doping profile within the device. In addition to the desire to maintain a thin collector (e.g., for optimal performance of HBT 100) with a high breakdown voltage (e.g., for capacitance tuning range of any of the varactors discussed above), it is, in some implementations, desirable for tuning layer 462 to have a non-uniform doping profile in order to control the (reverse biased) voltage versus capacitance characteristics of varactor 460. In some embodiments, the non-uniform profile is a hyper-abrupt profile given by, $$N = Bx^m$$

where B and m are constants, and x is a measure of the distance from the surface of the tuning layer proximal to the semiconductor base layer. In some implementations (e.g., a reverse biased pn-junction with a hyper-abrupt doping profile), varactor 460 has a capacitance as a function of reverse bias approximated by, $$C(V_R) = \left\{ \frac{eB \, \epsilon_S^{m+1}}{(m+2)(V_{bi}+V_R)} \right\}^{\frac{1}{m+2}}$$

where C is the capacitance of varactor 460, $V_R$ is the applied reverse bias voltage, e is the fundamental electron charge, $\epsilon_s$ is the permittivity of the second semiconductor material and $V_{bi}$ is a built-in voltage of the pn-junction that is well-known in the art. Various capacitance versus reverse bias relationships can thus be realized by adjusting m. In some implementations, varactor 460 is a placed in parallel with an inductor with inductance L. The resonance frequency of the LC-circuit created using varactor 460 is then, $$f_r = \frac{1}{2\pi\sqrt{LC}}$$

In some implementations, it is desirable to fabricate an LC-circuit with a resonance frequency that varies linearly as a function of $V_R$. In the example above, this is realized with m=−3/2. In some embodiments, however, m takes on different values (e.g., between −0.5 and −1.9).

In some embodiments, the non-uniform doping profile is non-uniform in other directions in addition to being non-uniform as a function of distance from the surface of the tuning layer proximal to the base layer. In some embodiments, the non-uniform doping distribution is considered hyper-abrupt if the difference between an ideal hyper-abrupt profile (e.g., given by the equation above) is less than a threshold everywhere within tuning layer 462. In some embodiments, the non-uniform doping profile is considered hyper-abrupt if an average difference (e.g., a root mean square, or "RMS" difference) is less than a threshold. In some embodiments, RMS difference is given by the function, $$\varepsilon_{RMS} = \sqrt{\frac{\int_V (N_I(r) - N_R(r))^2 \, d^3r}{\int_V d^3r}}$$

where $N_I$ is the ideal doping distribution, $N_R$ is the realized hyper-abrupt doping distribution, V is the volume of the tuning layer and r is a spatial vector.

Figure 6:
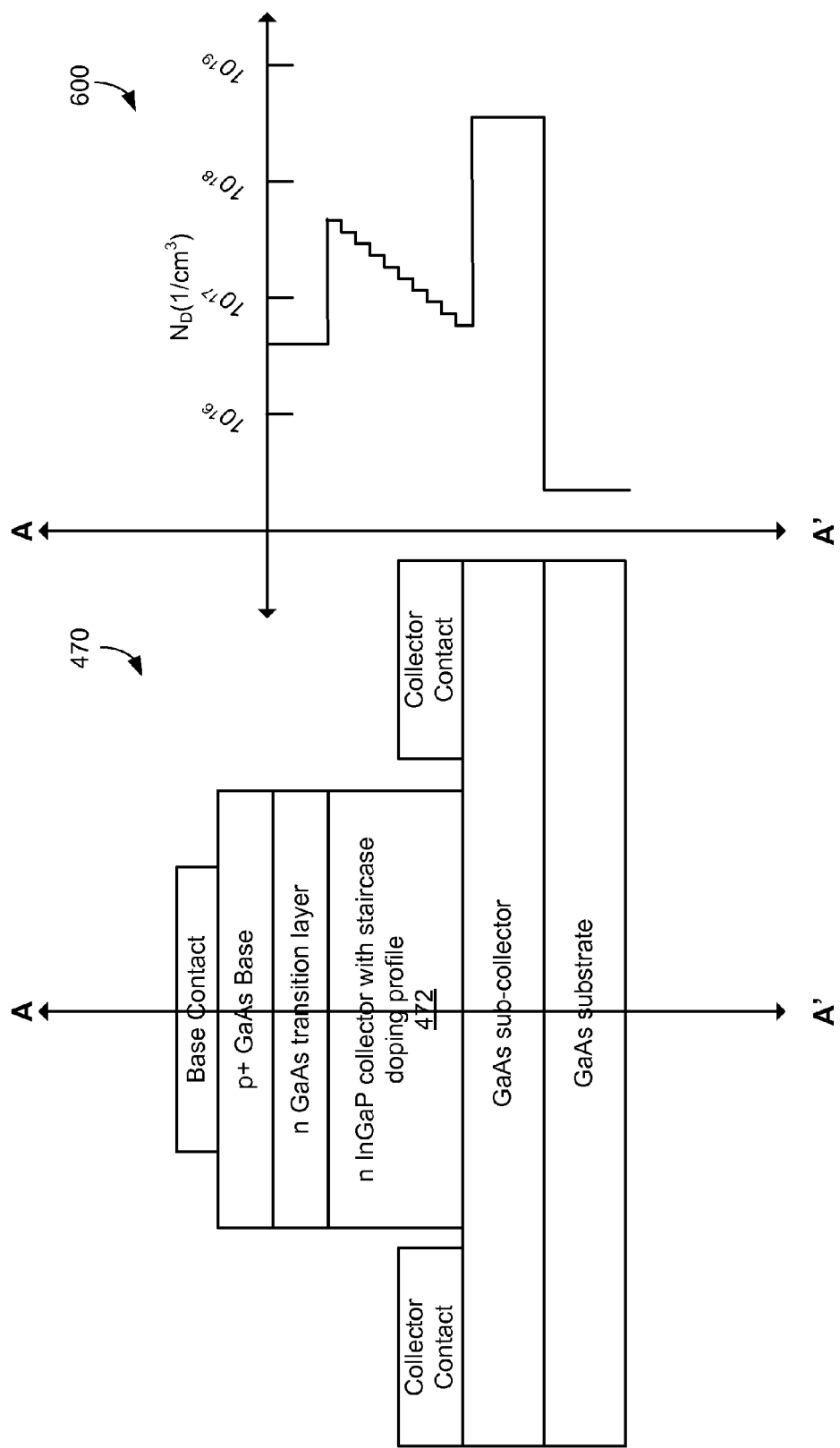
FIG. 6 is a schematic diagram with a cross-sectional view of a semiconductor device with a corresponding graph illustrating a staircase non-uniform doping profile in the tuning layer in accordance with some embodiments.

FIG. 6 illustrates a staircase non-uniform doping profile in tuning layer 472 of varactor 470. A schematic cross-sectional view of varactor 470 is shown as well as a simplified representation of a plot 600 of the doping profile within the device. In some embodiments, the staircase doping profile comprises a graded doping profile that monotonically decreases from the surface of the tuning layer proximal to the semiconductor base layer to an opposing surface of the tuning layer distal to the semiconductor base layer. In some implementations, each step of the staircase comprises a sub-layer of the tuning layer. In some embodiments, the staircase doping profile approximates a hyper-abrupt doping profile. In some embodiments, the staircase doping profile is a linearly graded doping profile. In some embodiments, the doping profile is considered a staircase profile if the difference between an ideal staircase doping profile and a realized doping profile is less than a threshold. Various manners in which an ideal doping profile and a realized doping profile can be compared are discussed above with reference to the hyper-abrupt doping profiles and apply to staircase doping profiles as well. In some embodiments, the doping profile is non-uniform in other directions in addition to being non-uniform as a function of distance from the surface of the tuning layer proximal to the base layer.

Figure 7:
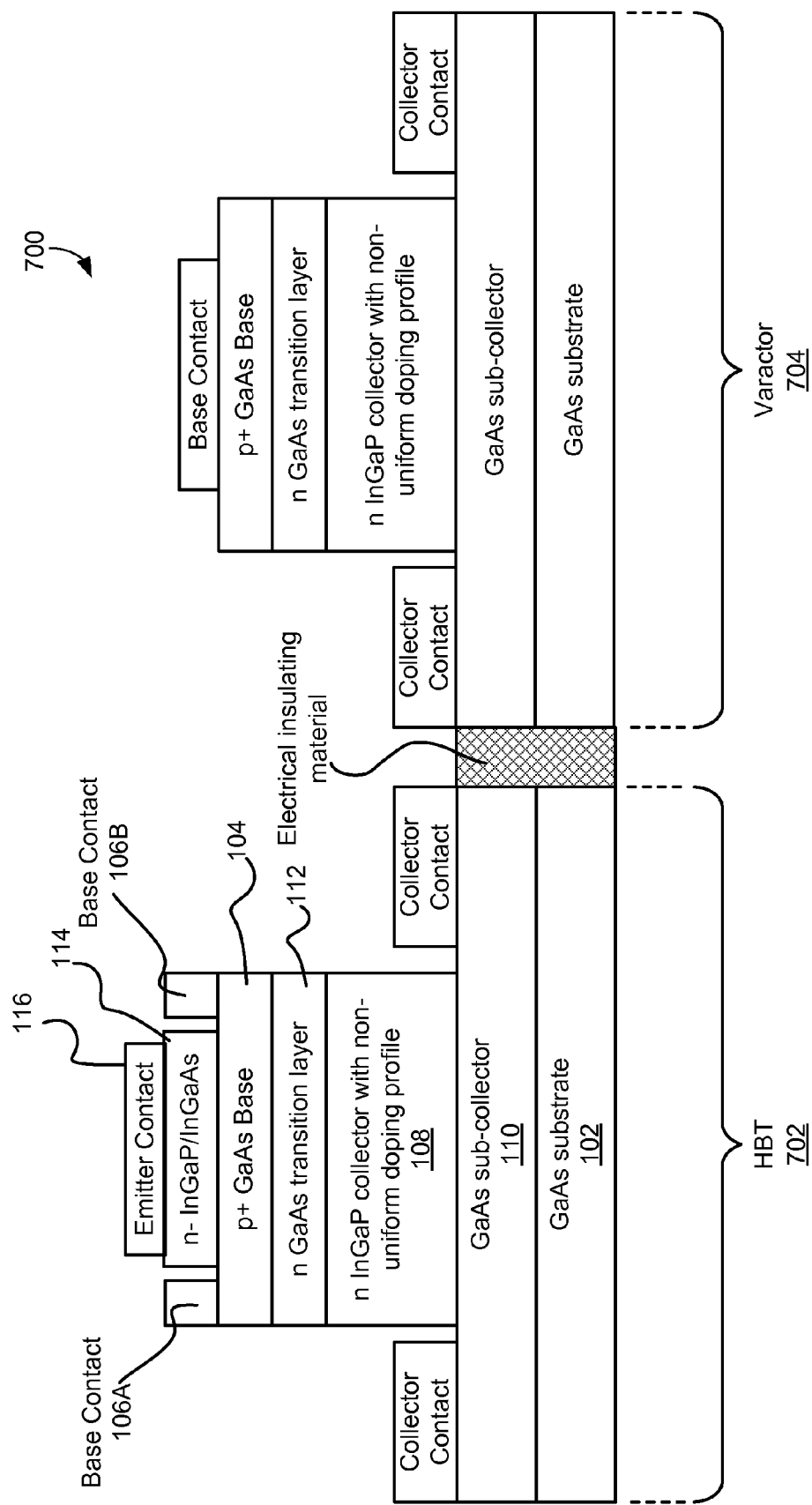
FIG. 7 is a schematic diagram with a cross-sectional view of a monolithic semiconductor device with an HBT and a varactor in accordance with some embodiments.

FIG. 7 is a schematic diagram with a cross-sectional view of a semiconductor device 700 comprising an HBT 702 and a varactor 704 disposed on the same chip. HBT 702 can be any of the embodiments of HBT 100 described above. Varactor 704 can be any of the embodiments of the varactors described above. In some embodiments, HBT 702 and varactor 704 are physically separated from one another on the chip. In some embodiments, 702 and varactor 704 are electrically isolated from one another on the chip, except through their respective contacts. Electrical isolation can be achieved by replacing or modifying the material between HBT 702 and varactor 704 so that it is an electrically insulating material. This can be realized by, for example, a combination of patterned etching and subsequent oxide growth, or, alternatively or in addition, by inducing material damage via ion implantation. In some embodiments, HBT 702 and varactor 704 are components in a MMIC. In some embodiments, HBT 702 and varactor 704 are components in a VCO.

Figure 8:
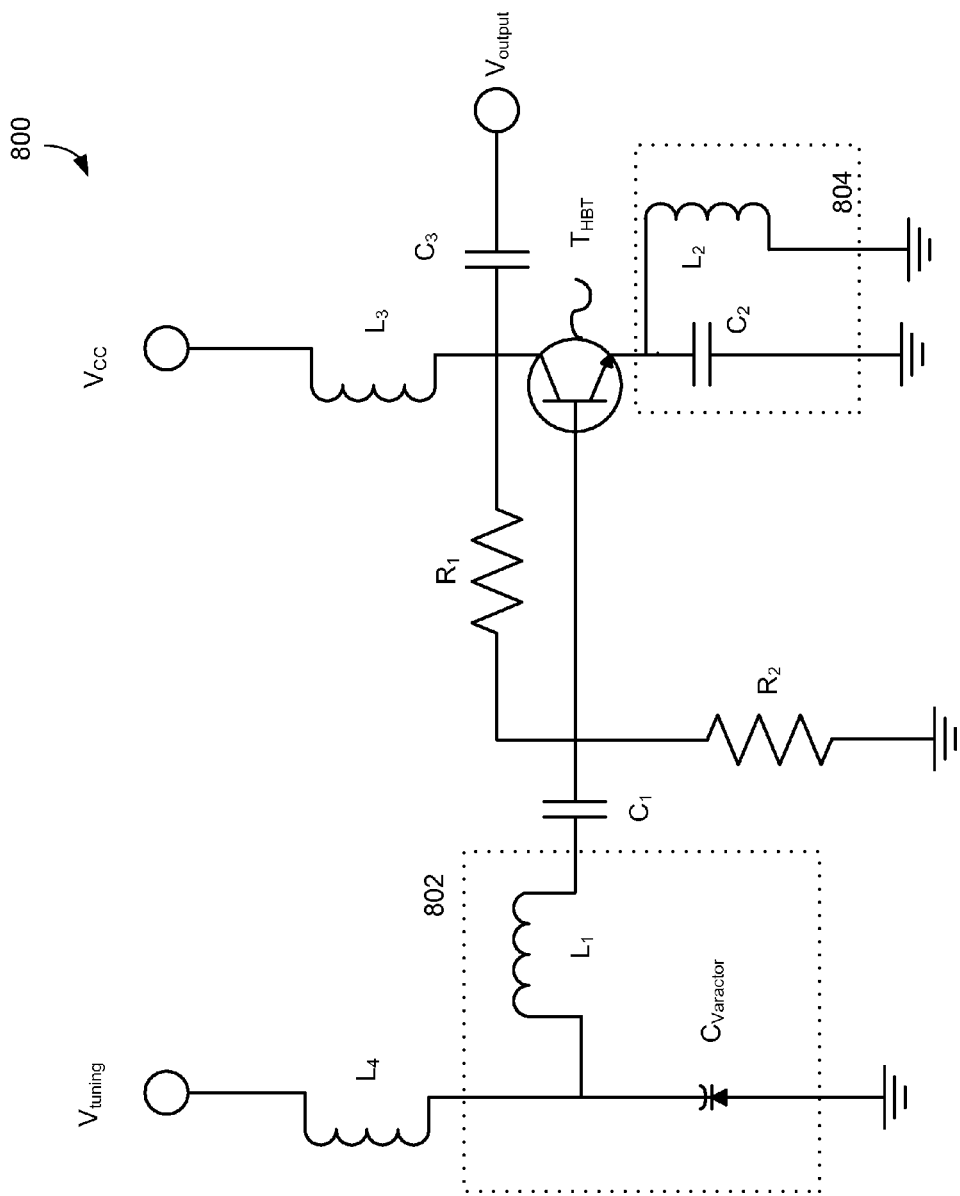
FIG. 8 is a block diagram illustrating a voltage controlled oscillator circuit in accordance with some embodiments.

FIG. 8 is a schematic diagram of a VCO 800 in accordance with some embodiments. Varactor $C_{Varactor}$ and inductor $L_1$ form a resonance circuit 802 with a tunable resonance frequency as described above. Inductor $L_4$ DC-couples tuning voltage $V_{tuning}$ to apply a reverse bias to varactor $C_{Varactor}$. Capacitor $C_1$ AC-couples resonant circuit 802 to the base of HBT $T_{HBT}$. Resistors $R_1$ and $R_2$ form a voltage divider with supply voltage Vcc to DC-bias the base of HBT $T_{HBT}$. Capacitor $C_2$ and inductor $L_2$ are coupled to the emitter of HBT $T_{HBT}$ and form a microwave matching resonance circuit. Capacitor $C_3$ AC-couples output $V_{out}$ of VCO 800 to external circuitry. Inductor $L_3$ couples voltage $V_{cc}$ to bias the collector of HBT $T_{HBT}$. Inductor L3 and capacitor $C_3$ together form a bias Tee.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain the principles of operation and their practical applications, to thereby enable others skilled in the art to utilize various embodiments with various modifications as suited to the particular use contemplated.

What is claimed is:

1. A semiconductor device having tunable capacitance, comprising:
    a substrate;
    a semiconductor base layer comprising a first semiconductor material having a first band-gap;
    a plurality of successive semiconductor layers positioned between the substrate and the semiconductor base layer, the plurality of successive semiconductor layers including a tuning layer comprising a second semiconductor material having a second band-gap larger than the first band-gap, wherein the tuning layer has a non-uniform doping profile with doping concentration that varies in accordance with distance from a surface of the tuning layer proximal to the semiconductor base layer;
    a first contact electrically coupled to the semiconductor base layer; and a second contact electrically coupled to a respective layer of the plurality of successive semiconductor layers;
wherein the tunable capacitance of the semiconductor device varies in accordance with an applied voltage between the first contact and second contact.

2. The semiconductor device of claim 1, wherein at least one of the substrate and a respective layer of the plurality of successive semiconductor layers, excluding the tuning layer, comprises a GaAs layer.

3. The semiconductor device of claim 1, wherein the tuning layer comprises an InGaP layer.

4. The semiconductor device of claim 1, wherein the non-uniform doping profile comprises a graded doping profile that monotonically decreases from the surface of the tuning layer proximal to the semiconductor base layer to an opposing surface of the tuning layer distal to the semiconductor base layer.

5. The semiconductor device of claim 1, wherein the non-uniform doping profile is a staircase doping profile.

6. The semiconductor device of claim 1, wherein the non-uniform doping profile is a hyper-abrupt doping profile.

7. The semiconductor device of claim 1, wherein the plurality of successive semiconductor layers positioned between the substrate and the semiconductor base layer includes a transition layer between the tuning layer and the semiconductor base layer.

8. The semiconductor device of claim 7, wherein the transition layer is a layer of the same material as the semiconductor base layer, but with a different doping type than a doping type of the semiconductor base layer.

9. The semiconductor device of claim 8, wherein the transition layer is an n-type GaAs layer and the semiconductor base layer is a p-type GaAs layer.

10. The semiconductor device of claim 1, wherein the semiconductor device comprises a heterojunction bipolar transistor (HBT) having a base, collector and emitter, the semiconductor base layer comprises the base of the HBT, at least one respective layer of the plurality of successive semiconductor layers comprises the collector of the HBT, and the semiconductor device further comprises one or more additional semiconductor layers that comprise the emitter of the HBT.

11. The semiconductor device of claim 10, wherein the HBT is a double heterojunction bipolar transistor (DHBT).

12. The semiconductor device of claim 11, wherein at least one of the one or more additional semiconductor layers that comprise the emitter of the DHBT is layer in the group consisting of a GaAs layer, an InGaP layer, and an InGaAs layer.

13. The semiconductor device of claim 1, wherein the semiconductor device is a monolithic semiconductor device that comprises a voltage controlled oscillator that includes a heterojunction bipolar transistor (HBT) and at least one additional circuit element, the HBT including the substrate, a semiconductor base layer, plurality of successive semiconductor layers positioned between the substrate and the semiconductor base layer, the first contact and the second contact.

14. The semiconductor device of claim 1, wherein the semiconductor device is a monolithic semiconductor device that comprises a voltage controlled oscillator that includes a varactor and at least one additional circuit element, the varactor including the substrate, a semiconductor base layer, plurality of successive semiconductor layers positioned between the substrate and the semiconductor base layer, the first contact and the second contact.

15. A monolithic semiconductor device, comprising:
a substrate;
a transistor structure positioned on the substrate;
a varactor structure positioned on the substrate and physically separated from the transistor structure on the substrate;
wherein both the transistor structure and the varactor structure have distinct instances of a common set of layers, the common set of layers comprising:
a semiconductor base layer comprising a first semiconductor material having a first band-gap;
a plurality of successive semiconductor layers positioned between the substrate and the semiconductor base layer, the plurality of successive semiconductor layers including a tuning layer comprising a second semiconductor material having a second band-gap larger than the first band-gap, wherein the tuning layer has a non-uniform doping profile with doping concentration that varies in accordance with distance from a surface of the tuning layer proximal to the semiconductor base layer;
a first contact electrically coupled to the semiconductor base layer; and
a second contact electrically coupled to a respective layer of the plurality of successive semiconductor layers;
wherein the varactor structure has a tunable capacitance that varies in accordance with an applied voltage between the first contact of the varactor structure and second contact of the varactor structure.

16. The monolithic semiconductor device of claim 15, wherein the transistor structure further includes one or more additional semiconductor layers that comprise an emitter of the transistor structure, and a third contact electrically coupled to a respective layer of the one or more additional semiconductor layers, the third contact comprising an emitter contact.

17. The monolithic semiconductor device of claim 16, wherein at least one of the one or more additional semiconductor layers that comprise the emitter of the transistor structure is a layer in the group consisting of a GaAs layer, an InGaP layer, and an InGaAs layer.

18. The monolithic semiconductor device of claim 15, wherein the tuning layer comprises an InGaP layer.

19. The monolithic semiconductor device of claim 15, wherein the non-uniform doping profile comprises a graded doping profile that monotonically decreases from the surface of the tuning layer proximal to the semiconductor base layer to an opposing surface of the tuning layer distal to the semiconductor base layer.

20. The monolithic semiconductor device of claim 15, wherein the non-uniform doping profile is a staircase doping profile.

21. The monolithic semiconductor device of claim 15, wherein the non-uniform doping profile is a hyper-abrupt doping profile.

22. The monolithic semiconductor device of claim 15, wherein the plurality of successive semiconductor layers positioned between the substrate and the semiconductor base layer includes a transition layer between the tuning layer and the semiconductor base layer.

23. The monolithic semiconductor device of claim 22, wherein the transition layer is a layer of the same material as the semiconductor base layer, but with a different doping type than a doping type of the semiconductor base layer.

24. The monolithic semiconductor device of claim 23, wherein the transition layer is an n-type GaAs layer and the semiconductor base layer is a p-type GaAs layer.

* * * * *

UNITED STATES PATENT AND TRADEMARK OFFICE
CERTIFICATE OF CORRECTION

PATENT NO. : 8,716,757 B1  
APPLICATION NO. : 13/665876  
DATED : May 6, 2014  
INVENTOR(S) : Yang et al.

Page 1 of 1

It is certified that error appears in the above-identified patent and that said Letters Patent is hereby corrected as shown below:

Title Page, insert -- (65)   Prior Publication Data

US 2014/0110761 A1    April 24, 2014 --

Signed and Sealed this
Fourteenth Day of October, 2014

Michelle K. Lee
*Deputy Director of the United States Patent and Trademark Office*